(12) United States Patent
Yang

(10) Patent No.: US 6,316,734 B1
(45) Date of Patent: Nov. 13, 2001

(54) FLEXIBLE CIRCUITS WITH STATIC DISCHARGE PROTECTION AND PROCESS FOR MANUFACTURE

(75) Inventor: Rui Yang, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/519,682

(22) Filed: Mar. 7, 2000

(51) Int. Cl.[7] .................................................. H05K 1/03
(52) U.S. Cl. .................. 174/256; 174/250; 174/254; 174/257; 174/258; 361/220; 361/748; 361/750; 361/751; 428/209; 428/408; 427/77; 427/78; 427/96; 427/99; 29/846
(58) Field of Search ........................... 174/35 R, 35 GC, 174/35 MS, 250, 254–258; 361/117, 118, 126, 127, 220, 748, 749–751, 792, 795, 816, 818; 428/209, 210, 408, 901, 922, 929, 931; 156/51, 52, 55, 273.1; 427/58, 70, 77, 78, 99, 96, 113, 118; 29/825, 829–931, 846

(56) References Cited

U.S. PATENT DOCUMENTS

| | | | |
|---|---|---|---|
| 2,323,461 | * | 7/1943 | Donelson ................. 361/220 |
| 4,231,154 | | 11/1980 | Gazdik et al. ................. 29/840 |
| 4,400,410 | | 8/1983 | Green et al. ................. 427/39 |
| 4,480,288 | | 10/1984 | Gazdik et al. . |
| 4,484,250 | * | 11/1984 | Rzepecki et al. ................. 361/220 |
| 4,504,410 | | 3/1985 | Hempel et al. ................. 252/358 |
| 4,537,813 | * | 8/1985 | Kuyel ................. 428/209 |
| 4,559,579 | * | 12/1985 | Val ................. 361/220 |
| 4,586,105 | * | 4/1986 | Lippmann et al. ................. 361/117 |
| 4,698,256 | | 10/1987 | Giglia et al. ................. 428/216 |
| 4,746,538 | | 5/1988 | Mackowski ................. 427/38 |
| 4,809,876 | | 3/1989 | Tomaswick et al. ................. 220/458 |
| 4,849,617 | * | 7/1989 | Ueda ................. 361/749 |
| 4,910,499 | * | 3/1990 | Benge et al. ................. 156/51 |
| 4,914,551 | | 4/1990 | Anschel et al. . |
| 5,041,319 | * | 8/1991 | Becker et al. ................. 428/922 |
| 5,153,573 | | 10/1992 | Ohta et al. . |
| 5,160,374 | * | 11/1992 | Frederickson et al. ................. 361/220 |
| 5,162,875 | | 11/1992 | Birkle et al. ................. 257/636 |
| 5,190,824 | | 3/1993 | Itoh ................. 428/408 |
| 5,227,008 | | 7/1993 | Klun et al. ................. 156/630 |
| 5,289,336 | * | 2/1994 | Gagliano ................. 174/254 |
| 5,318,855 | * | 6/1994 | Glovatsky et al. ................. 428/209 |
| 5,319,479 | | 6/1994 | Yamada et al. . |

(List continued on next page.)

FOREIGN PATENT DOCUMENTS

| | | | |
|---|---|---|---|
| 3444980 A1 | 6/1985 | (DE) | ................. H05K/1/00 |
| 0090516 | 10/1983 | (EP) | ................. C07D/471/04 |
| WO 99/12404 | 3/1999 | (WO) | ................. H05K/3/28 |

OTHER PUBLICATIONS

Standard Test Methods for DC Resistance or Conductance of Insulating Materials; pub. as Document D257 by ASTM, Nov. 1999; pp. 1–18.*

Primary Examiner—Jeffrey Gaffin
Assistant Examiner—John B. Vigushin
(74) Attorney, Agent, or Firm—Darla P. Fonseca

(57) ABSTRACT

Circuit and circuit carries include a dielectric substrate having a conductive layer mounted thereon. The conductive layer is patterned to define a plurality of spaced apart conductive elements. A static charge dissipative layer is in contact with and extending between at least two of the conductive elements. The static charge dissipative layer has a surface resistivity of between about $1\times10^5$ and about $1\times10^{10}$ ohms/□. The static charge dissipative layer is made of a material selected from the group consisting of diamond-like carbon, silicon nitride, boron nitride, boron trifluoride, silicon carbide and silicon dioxide. Circuits and circuit carriers according to the present invention allow static charges to be controllably and reliably dissipated from a surface of the circuit or circuit carrier such that the potential for damage from static discharge to electrical components connected to the circuit is reduced.

19 Claims, 5 Drawing Sheets

U.S. PATENT DOCUMENTS

| | | | |
|---|---|---|---|
| 5,326,414 | * | 7/1994 | Mosher et al. ............................ 29/830 |
| 5,350,594 | * | 9/1994 | Unruh ...................................... 427/96 |
| 5,401,913 | | 3/1995 | Gerber et al. ........................ 174/264 |
| 5,508,092 | | 4/1996 | Kimock et al. ...................... 428/216 |
| 5,557,064 | * | 9/1996 | Isern-Flecha et al. .............. 174/35 R |
| 5,559,367 | | 9/1996 | Cohen et al. ........................... 257/77 |
| 5,595,801 | * | 1/1997 | Fahy et al. .......................... 174/35 R |
| 5,597,979 | * | 1/1997 | Courtney et al. ................... 174/35 R |
| 5,643,343 | | 7/1997 | Selifanov et al. ...................... 51/306 |
| 5,707,409 | | 1/1998 | Martin et al. ........................... 51/295 |
| 6,075,707 | * | 6/2000 | Ferguson et al. ..................... 361/750 |
| 6,229,085 | * | 5/2001 | Gotoh et al. ..................... 174/35 MS |
| 6,246,566 | * | 6/2001 | Glenn ................................... 361/220 |

\* cited by examiner

FLEXIBLE CIRCUITS WITH STATIC DISCHARGE PROTECTION AND PROCESS FOR MANUFACTURE

FIELD OF THE INVENTION

The invention relates to flexible circuits and carriers for flexible circuits. More specifically, the invention relates to diamond-like carbon film, and to materials having similar properties, that enhance the static charge dissipating characteristics and performance of flexible circuit carriers and flexible circuits made therewith.

BACKGROUND OF THE INVENTION

Flexible circuits are circuits that are formed on flexible dielectric substrates such as polymeric materials. The circuits may have one or more conductive layers as well as circuitry on one of the major surfaces or on both major surfaces. The circuits often include additional functional layers, e.g., insulative layers, adhesive layers, encapsulating layers, stiffening layers and the like. Flexible circuits are typically useful for electronic packages where flexibility, weight control and the like are important. In many high volume situations, flexible circuits also provide cost advantages associated with efficiency of the manufacturing processes employed.

U.S. Pat. No. 4,914,551 discloses circuits as provided on flexible dielectric materials. U.S. Pat. No. 4,231,154 discloses a flexible circuit with conductive traces on one or both major surfaces. U.S. Pat. No. 4,480,288 discloses flexible circuits with circuitry on both major surfaces. U.S. Pat. No. 5,401,913 discloses a multi-layer flexible circuit including multiple flexible circuits stacked relative to one another and interconnected using metallized through-holes commonly referred to as vias. All of these references disclose various aspects of flexible circuits, but none make mention of the benefits of utilizing diamond-like carbon or materials providing diamond-like carbon properties to enhance the static charge dissipative characteristics and performance of flexible circuits.

Various types of flexible circuits are known in the industry. Generally speaking, the key differences in the various circuits stem from a number of design requirements for the devices that the circuit is connecting together, along with the requirements and limitations of the processing methods used to make the circuit. Typically, the flexible circuit is connecting a semiconductor device of some sort (integrated circuit, microprocessors, or the like) to another flex circuit, a rigid circuit board or a component of a device. The design factors associated with items the circuit is connecting include, but are not limited to, the number of input and output (I/O) leads from a semiconductor device that needs to be connected; the means and process for interconnection of the flexible circuits to another circuit or to a device; the required size and weight of the finished product; the environmental conditions under which the circuit will be assembled and used; and the data transmission rates to which the circuit will be subjected. All of these design factors as well as the methods and equipment used to manufacture the circuit will at least partially determine circuit design parameters. Circuit design parameters include whether the means for interconnecting the flexible circuit to another item is a Ball Grid Array (BGA), an array of bonding pads, or series of discrete leads; whether the circuit has one or more conductive layers, and if so, on one or both sides; if the materials need to be chemically stable to prevent outgassing; or if they need to be compatible for use and assembly at elevated temperature and humidity levels.

Diamond coatings, diamond-like carbon films, and uses for them are also known. These coatings and films possess a number of desirable properties, including high hardness, optical clarity, low friction, high thermal conductivity, high dielectric constant, high chemical stability, low gas and vapor permeability, and other properties. Furthermore, the composition of diamond-like carbon can be modified to control the measured value for many of these properties. The typical properties for diamond-like carbon are presented in the table below.

| Typical Properties for Diamond-Like Carbon | |
|---|---|
| Density, $g/cm^3$ | 1.6–3.0 |
| Hardness, Vickers, $kg/mm^2$ | 2000–9000 |
| Young's Modulus, Gpa | 100–200 |
| Dielectric Constant | 8–12 (between 45MHz and 20 GHz) |
| Electrical Resistivity, ohms/□ | $10^5$–$10^{15}$ |
| Excitation Coefficient | .001–0.5 (between 200 and 1000 nm) |
| Index of Refraction @ 10 $\mu$m | 1.8–2.4 |
| Optical Band-Gap | 0.8–3.0 eV |
| Thermal Conductivity @ 25 C., W/m-K | 400–1000 |

Diamond-like carbon coatings and films may be formed and deposited by processes using hydrocarbon or carbon sources. Carbon source deposition methods include ion beam sputter deposition, DC magnetron sputter deposition, pulsed cathodic arc deposition, laser ablation deposition, and ion beam assisted carbon evaporation. Hydrocarbon source deposition methods include ion beam, microwave plasma, directed plasma discharge, various types of plasma-assisted chemical deposition methods, radio frequency plasma deposition, cathodic arc deposition, and the like. U.S. Pat. Nos. 4,698,256; 4,400,410; 4,383,728; 4,504,410; 4,746,538; 5,643,343; and 7,707,409 disclose known processes for producing diamond-like carbon films and coatings.

Diamond and diamond-like carbon films are currently being used in a variety of applications. These applications include eyeglasses, semiconductor devices, drilling and machining tools, beverage containers, and many other applications requiring one or more of the properties provided by diamond-like carbon. U.S. Pat. No. 5,508,071 discloses an annular interior surface having a layer of diamond coating for improved abrasion resistance. The coating is deposited on substrates such as metal, alloys, and ceramics. Because chemical vapor deposition (CVD) of diamond layers takes place at very high temperatures, it cannot be used for many polymeric substrates such as polyimide that will degrade at the elevated diamond-forming temperatures. Further, the polycrystalline nature of CVD diamond dictates a very hard, brittle coating with little flexibility.

The term "diamond-like carbon" is typically applied to noncrystalline materials, especially those in which tetrahedral diamond bonds predominate. U.S. Pat. No. 4,576,964 discloses barrier films made from flexible polymeric substrates having amorphous carbon coatings adhering thereto. U.S. Pat. No. 5,508,092 discloses optically transparent abrasion wear resistant coated substrates comprising a parent substrate, one or more interlayers and a top coating of diamond-like carbon or other low-friction material. U.S. Pat. No. 5,559,367 discloses the use of diamond-like carbon to electrically insulate levels within semiconductors. U.S. Pat. No. 4,809,876 discloses polymeric beverage containers utilizing a coating of diamond-like carbon to reduce the gas and vapor permeability through the container.

Polymeric films, such as those used in flexible circuits, are typically electrically insulating and exhibit a propensity towards the generation of static electrical charges (referred to hereinafter as static charges). Static charges are undesirable for a number of reasons. Contaminants such as dust particles are attracted by static charges. Static charges are also known to damage various types of electronic devices, such as semiconductor devices, due to electrical currents associated with the discharge of accumulated static charges. For example, flexible circuits are now used in many hard disk drives for providing electrical connection between the actuator arm and the head assembly. The rapid dissipation of static charges (hereinafter referred to as static discharge) during assembly of the flexible circuit to the head assembly is one of the major sources of failure. The heads in disk drives can be destroyed by relatively small amounts of current associated with static discharge.

Therefore, what is needed is a flexible circuit construction that permits static charges to be controllably and reliably dissipated from a surface of the circuit such that the potential for damage from static discharge to electrical components connected to the circuit is reduced.

SUMMARY OF THE INVENTION

Accordingly, in one embodiment of the present invention, a circuit includes a conductive layer patterned to define a plurality of spaced apart conductive elements and a static charge dissipative layer in contact with and extending between at least two of the conductive elements. The static charge dissipative layer has a surface resistivity of between about $1 \times 10^5$ and about $1 \times 10^{10}$ ohms/□. The static charge dissipative layer is made of a material selected from the group consisting of diamond-like carbon, silicon nitride, boron nitride, boron trifluoride, silicon carbide and silicon dioxide.

The static charge dissipative material is a highly inert material having a typical surface resistivity of between about 133 $10^5$ and about $1 \times 10^{10}$ ohms/□ and a preferred surface resistivity of between about $1 \times 10^6$ and about $1 \times 10^8$ ohms/□. A thin film carbon-rich material such as diamond-like carbon is a preferred static charge dissipative material. One or more layers of diamond-like carbon deposited onto a flexible circuit during the appropriate steps of the manufacturing process has been found to result in improved dissipation of static charges from a surface of a flexible circuit. Although diamond-like carbon is the preferred material to provide the desired static charge dissipative performance and characteristics, other materials having surface resistivity properties comparable to diamond-like carbon could also be used.

Flexible circuits comprise a carrier such as a polymeric dielectric substrate and a conductive layer on the carrier. The conductive layer is patterned to include a plurality of conductive elements such as traces, bonding pads and leads. The conductive elements may be formed by many different conventional processes, and of any number of conventional materials. Polyimide is a preferred dielectric substrate for flexible circuits and copper is a preferred material for the conductive layer.

Another embodiment provides a flexible circuit including a flexible dielectric substrate having plurality of spaced apart conductive elements mounted thereon. At least a portion of the conductive elements include a bonding portion and a routing portion. A conformal static charge dissipative layer is formed on an exposed surface of and extends between the routing portion of a plurality of the conductive elements.

The static charge dissipative layer has a surface resistivity of between about $1 \times 10^5$ and about $1 \times 10^{10}$ ohms/□.

A further embodiment provides a process for making a printed circuit including the steps of forming a plurality of conductive elements on a dielectric substrate and forming a static charge dissipative layer in contact with and extending between at least a portion of two of the conductive elements. The static charge dissipative layer has a surface resistivity of between about $1 \times 10^5$ and about $1 \times 10^{10}$ ohms/□.

Methods for depositing a layer of carbon-rich material onto flexible circuits and flexible circuit carriers according to the present invention include methods such as RF chemical vapor deposition, ion beam sputtering, and pulsed cathodic arc deposition. Preferred methods of deposition include RF chemical vapor deposition and pulsed cathodic arc deposition.

The following terms have the defined meanings when used herein:

1. The terms "carrier" and "flexible circuit carrier" refer to a package useful for a flexible circuit, but which does not yet have conductive elements formed thereon.

2. The terms "diamond-like carbon" and "carbon rich film" are synonymous and interchangeable in the industry, and refer to carbon films primarily including carbon without long range atomic order as disclosed in Plasma Deposited Films, Ed. J. Mort and F. Joanne, CRC Press, Boca Raton, Fla., 1986.

3. The terms "tape automated bonding" and "TAB" are synonymous and refer to the format and assembly method of a circuit.

4. The terms "etching" and "milling" are used synonymously, and include mechanical, chemical and optical processes for removing material, including chemical etching, laser ablation, mechanical milling and the like.

5. The term "conductive elements" refers to features patterned in a conductive layer such as, for example, solder ball pads, bonding pads and traces.

6. The term "static charge dissipative material" refers to a material having generally insulative properties with a surface resistivity that supports the discharge of static electricity from the surface of a layer of the material.

7. The term "conformal layer" refers to a static charge dissipative layer that conforms to the conductive elements formed in the dielectric substrate.

8. The term "exposed surface" refers to a surface of a conductive element that is not in contact with the dielectric substrate.

All ratios, parts, and percents described herein are by weight, unless otherwise specifically stated.

DETAILED DESCRIPTION OF THE INVENTION

Circuit Carriers and Circuits

Flexible circuits and carriers according to the present invention are those including a dielectric substrate, at least one conductive layer on the dielectric substrate patterned to define a plurality of conductive elements and at least one static charge dissipative layer formed on and extending between at least a portion of two of the conductive elements. The static charge dissipative layer is made of a highly inert material having a surface resistivity of between about $1\times10^5$ and about $1\times10^{10}$ ohms/□. The static charge dissipative layer contacts at least a portion of two of the conductive elements of the flexible circuit to provide for controlled and predictable dissipation of static charge from surfaces of the conductive elements and dielectric substrate of the flexible circuit.

Figure 1:
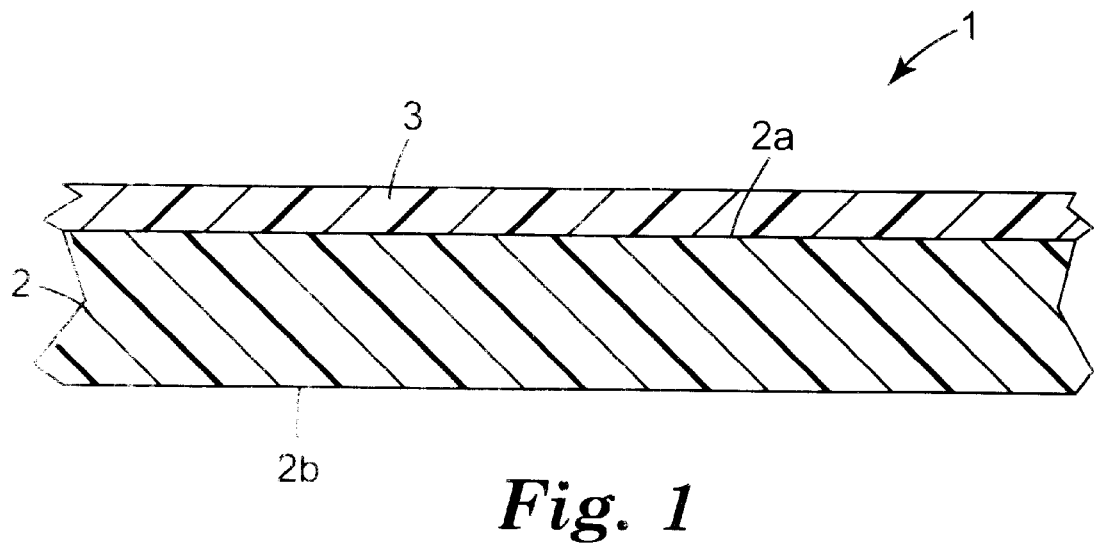
FIG. 1 is a cross-sectional view illustrating an embodiment of a circuit carrier including a static charge dissipative layer formed on a dielectric substrate.

FIG. 1 illustrates an embodiment of a flexible circuit carrier 1 including a dielectric substrate 2 having a first major surface 2a and a second major surface 2b. The dielectric substrate 2 is made of a polymeric material such as, for example, polyimide or polyester. A static charge dissipating layer 3 such as, for example, diamond-like carbon is formed on the first major surface 2a of the dielectric substrate 2. The dielectric substrate 2 has a thickness of typically from about 1 mil to about 10 mils. The static charge dissipative layer 3 has a thickness of typically from about 200 Angstroms to about 3000 Angstroms and, preferably, from about 200 Angstroms to about 500 Angstroms.

Figure 2:
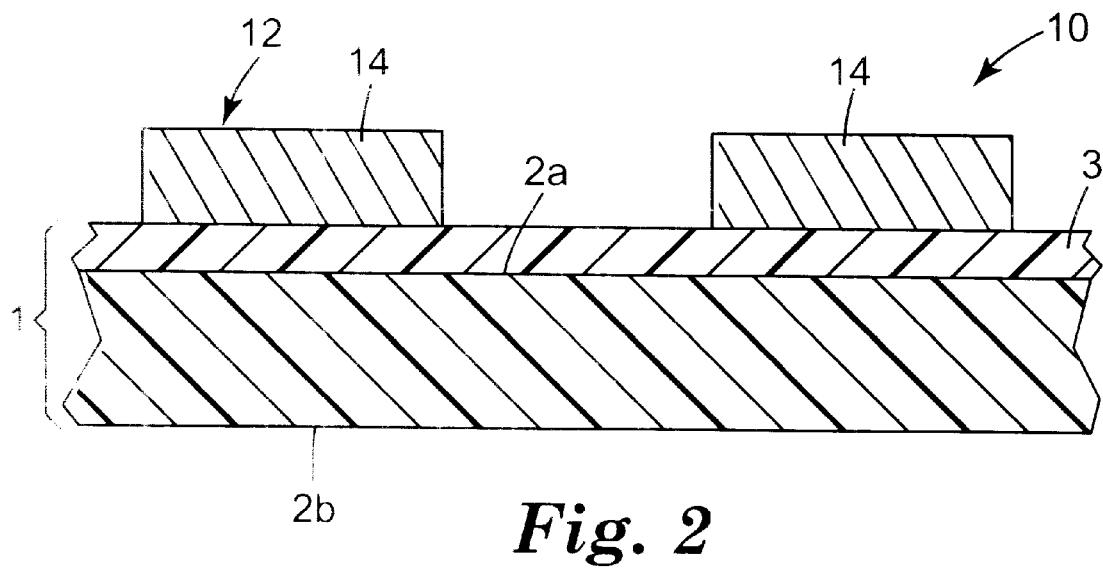
FIG. 2 is a cross sectional view illustrating an embodiment of a circuit including plurality of conductive elements mounted on the circuit carrier illustrated in FIG. 1.

An embodiment of a circuit 10 is illustrated in FIG. 2. The circuit 10 is constructed using the circuit carrier 1 of FIG. 1 and includes a conductive layer 12 mounted on the static charge dissipating layer 3 of the circuit carrier 1. The conductive layer 12 is patterned to include a plurality of conductive elements 14 such as, for example, traces, bonding pads and solder ball pads.

The static charge dissipating layer 3 is a generally insulating material with a relatively low surface resistivity. A carbon-rich material such as diamond-like carbon has been found to be a suitable material for the static charge dissipative layer 3. A layer of diamond-like carbon may be produced to have a surface resistivity that is low enough to facilitate the dissipation of static charges, but high enough to prevent shorting and signal cross talk between the conductive elements 14.

Figure 3:
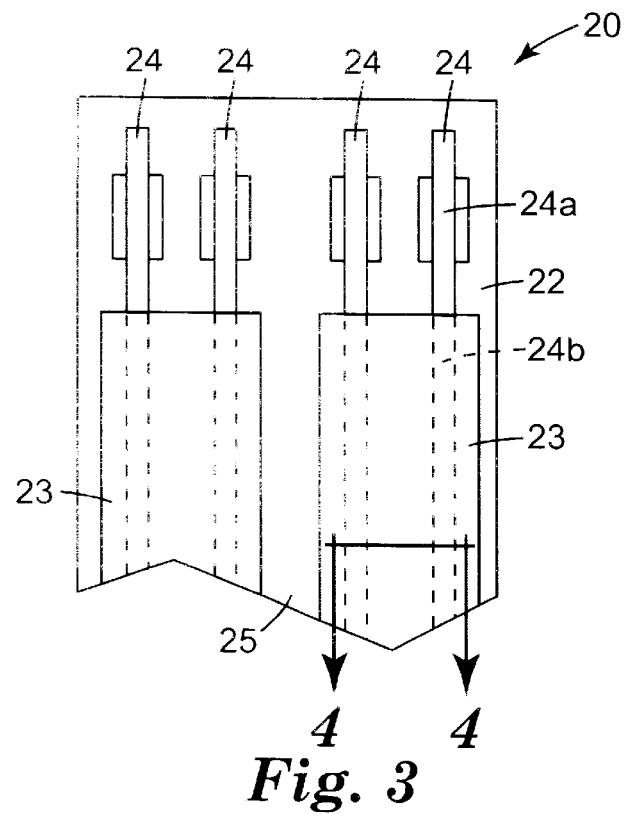
FIG. 3 is a fragmentary plan view illustrating an embodiment of a circuit including plurality of pairs of conductive elements, each pair having a layer of static charge dissipative coating formed thereon.
Figure 4:
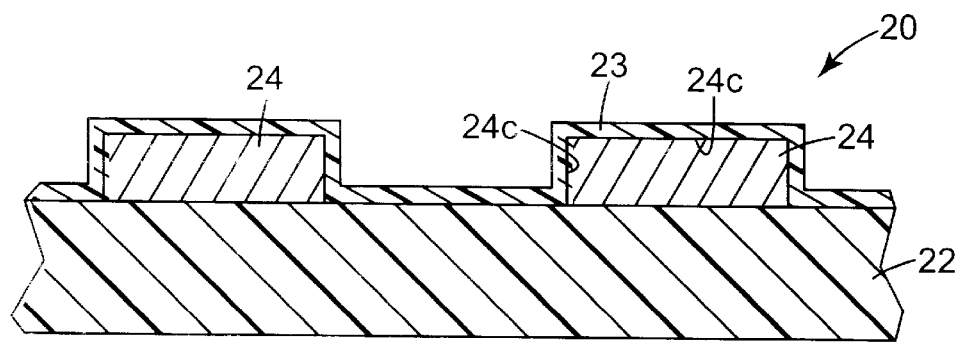
FIG. 4 is a cross-sectional view taken along the line 4—4 in FIG. 3.

Another embodiment of a circuit 20 is illustrated in FIGS. 3 and 4. The circuit 20 includes a dielectric substrate 22 and a plurality of conductive elements 24 mounted on the dielectric substrate 22. A portion of each conductive element 24 includes a bonding portion 24a and a routing portion 24b. A conformal static charge dissipative layer 23 is formed over and extends between at least a portion of an exposed surface 24c of two of the conductive elements 24. The static charge dissipative layer 24 is formed on the routing portion 24b. To optimize bonding performance, the static charge dissipative layer 24 is not formed on the bonding portion 24a. The conformal static charge dissipative layer 23 is patterned such that a discontinuity 25 is established between two adjacent sets of the conductive elements 24, FIG. 3.

Figure 5:
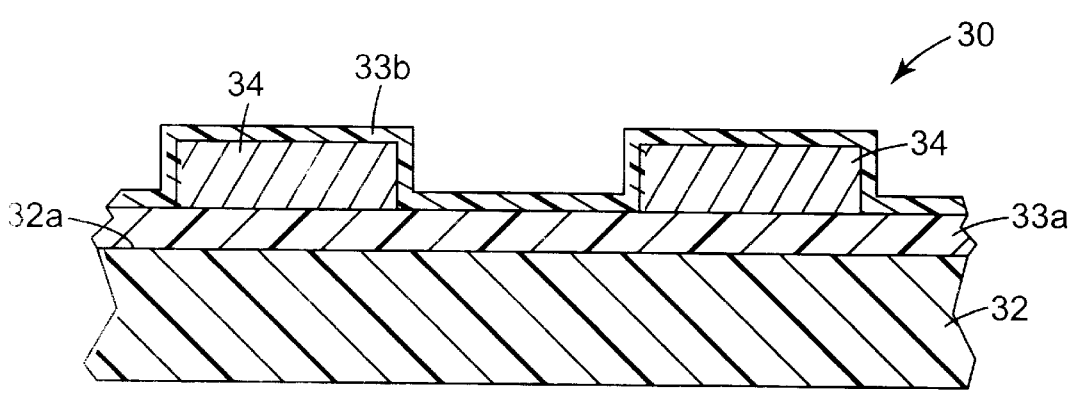
FIG. 5 is a cross sectional view illustrating an embodiment of a circuit including a plurality of conductive elements encapsulated between a first layer and a second static charge dissipative layer.

A further embodiment of a circuit 30 is illustrated in FIG. 5. The circuit 30 includes a dielectric substrate 32 and a first static charge dissipative layer 33a formed on a first major surface 32a of the dielectric substrate 32. A plurality of conductive elements 34 are formed on the first static charge dissipative layer 33a. A conformal second static charge dissipative layer 33b is formed over and extends between at least two adjacent conductive elements 34.

Useful static charge dissipative materials include diamond-like carbon, silicon nitride, boron nitride, boron trifluoride, silicon carbide, silicon dioxide and the like. Preferably, the static charge dissipating layer is diamond-like carbon (DLC). Also known as thin film carbon rich coatings, diamond-like carbon coatings contain two types of carbon-carbon bonds; trigonal graphite bonds (sp2) and tetrahedral diamond bonds (sp3), with tetrahedral bonds predominating. Diamond like carbon thus exhibits many of the properties of diamond, e.g., it is quite hard, chemically inert, corrosion resistant and impervious to water vapor and oxygen, and some of the properties of graphite, e.g., smoothness, and strong adhesion to polymeric materials. It also has an extremely low electrical conductivity and optical transparency over a wide range of wavelengths.

It has been found that reducing the thickness of a static charge dissipative layer reduces the surface resistivity. An additional benefit of reducing the thickness of the static charge dissipating layers is an increased ability for the carrier or flexible circuit to be flexed without causing cracking or causing damage to the carrier or to the circuit. However, for a static charge dissipating layer within the preferred range of thickness, typical mechanical, thermal, electrical, optical, and physical properties of diamond-like carbon such as surface conductivity, flexural stiffness, surface hardness, thermal conductivity, dielectric constant, abrasion resistance, optical transmissivity, permeability, chemical stability, bond strength, and other properties are less prevalent or, in some instances, negligible.

Circuits of the invention may comprise diamond-like carbon layers coated by any of the variety of known deposition techniques (pulsed cathodic arc deposition, ion beam sputtering, RF chemical vapor deposition. etc.) which have been developed to deposit such layers including those using either solid carbon, solid carbon alloyed or gaseous hydrocarbon sources. The deposition method may be batchwise deposition or continuous deposition, although continuous deposition is preferred for manufacturing efficiency.

The surface resistivity characteristics of a diamond-like carbon layer formed from a solid carbon source are highly dependent on parameters of the process used for forming the diamond-like carbon layer. Consequently, to maintain a desired level of surface resistivity when using a solid carbon source, key process parameters such as chamber pressure, web speed, electric field power, etc. must be tightly controlled. These conditions can result in a costly and unreliable process.

The use of an alloyed carbon source reduces the sensitivity of process parameters relative to the resulting level of surface resistivity. This is desirable because a required level of surface resistivity can be achieved over a broader range of process settings. Suitable alloy materials include electrically conductive metals such as, for example, copper, aluminum, titanium, nickel and chromium. Each one of these materials is highly conductive. A carbon-alloy source containing relatively small amounts enhances the conductivity, albeit fractionally, of the resulting layer of diamond-like carbon, relieving the dependence on the process parameters of these materials for attaining the desired level of surface resistivity.

DC magnetron sputter deposition and pulsed cathodic arc deposition are preferable deposition processes for applications where adhesion is a critical requirement. In both of these processes, particles of a solid carbon target or a solid carbon alloy target are knocked off and accelerated towards the substrate. Increased adhesion, relative to processes such as RF chemical vapor deposition, is attained with ion beam sputtering and pulsed cathodic arc deposition processes as a result of impingement of material particles onto the substrate.

Chemical vapor deposition processes such as RF chemical vapor deposition are preferred for wide web applications where cross web uniformity is a critical requirement. In chemical vapor deposition processes, a plasma is formed in a chamber filled with a gas or a mixture of gases (vapor), such as a hydrocarbon gas mixture. A substrate is subjected to the plasma such that a layer of material is formed on the surface of the substrate. The vapor deposition aspect of these types of processes provides more uniform cross web thickness of the deposited coating.

Pulsed cathodic arc processes are preferred for applications where tightly controlled thickness of the deposited layer of material is a critical requirement. In a pulsed cathodic arc deposition process, a pulsed electric field is established between a solid carbon or solid carbon-alloy target and an electrode. In embodiments of the deposition apparatus according to the present invention, the electrode is a rotating drum that carries a web such as a circuit carrier or circuits. Particles from the target are deposited on the web. Unlike continuous power deposition processes such as DC magnetron sputtering, the duty cycle and magnitude of the pulsed electric field in a pulsed cathodic arc deposition process provide highly controllable process variables for controlling the thickness of the deposited layer of material.

Preferred processes of the invention for forming diamond-like carbon layers include pulsed cathodic arc deposition processes and RF chemical vapor deposition processes. Pulsed cathodic arc deposition processes and RF chemical vapor deposition processes may be performed using a deposition apparatus such as that described herein below. Although the process conditions and other aspects of the processes are different, the structural aspects of the deposition apparatus are suitable for both types of deposition processes.

Processes according to the present invention provide a thin DLC coating in which flaking is minimized and provide discriminate coating of substrates rather than indiscriminate coating of the entire evacuated chamber, providing improved efficiency, reduced waste, and the like. The diamond-like carbon coating may be formed in a variety of widths, with little or no cross web variation in coating weight or thickness. Details of suitable processes and apparatus therefore are taught, infra.

Circuit Carrier and Circuit Materials

The dielectric substrate is preferably a flexible polymeric film material that is substantially fully cured. Other useful organic polymers include polyimides including modified polyimides such as polyester imides and poly-imide-esters, polysiloxane imides, and polyamide, polymethylmethacrylate, polyesters such as poly(ethylene terephthalate), polycarbonates, polytetrafluoroethylenes and mixtures thereof. The polyimides are preferred polymeric films, with an especially preferred polyimide polymer being made from the anhydride of pyromellitic acid and 4,4 diamino-diphenyl ether available from E.I. DuPont de Nemours and Company under the tradename Kapton®. Variations include Kapton® H, Kapton® E and Kapton® V, among others. Another polyimide precursor is also available from DuPont under the tradename Pyralin®.

The conductive layers are typically formed from conductive metals such as tin, gold, silver, copper, chromium and the like. The thickness and disposition of such layers is highly dependent on the particular type of circuit or electronic package desired.

Deposition Apparatus

Deposition apparatus of the present invention differs from conventional carbon coating processes and apparatuses where plasma creation and ion acceleration are caused by power applied to different elements, and where formation of carbon-rich coatings occur on both the substrate and the apparatus rather than essentially on only the substrate.

Figure 6:
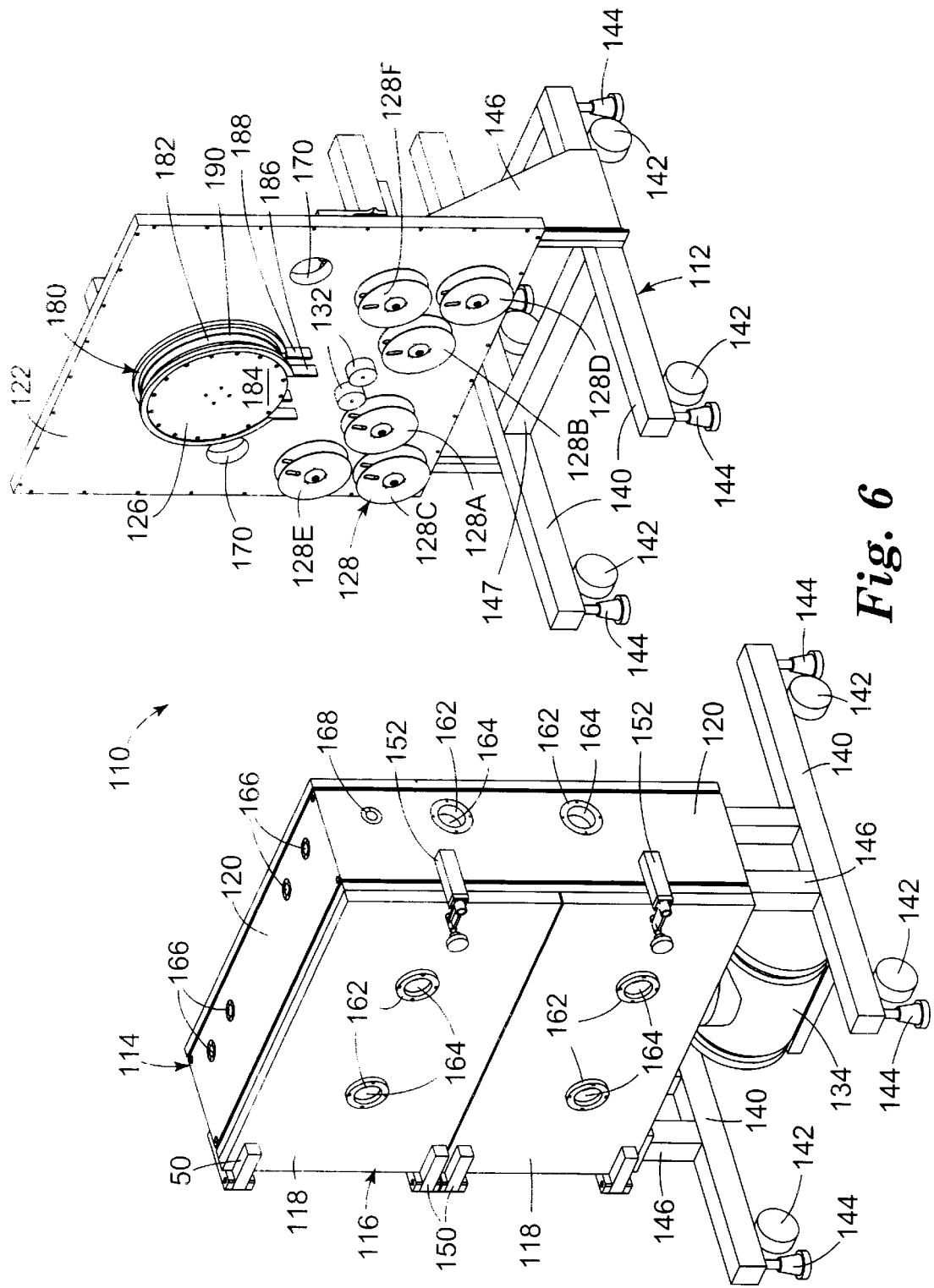
FIG. 6 is a first fragmentary perspective view of one embodiment of the deposition apparatus of the present invention.
Figure 7:
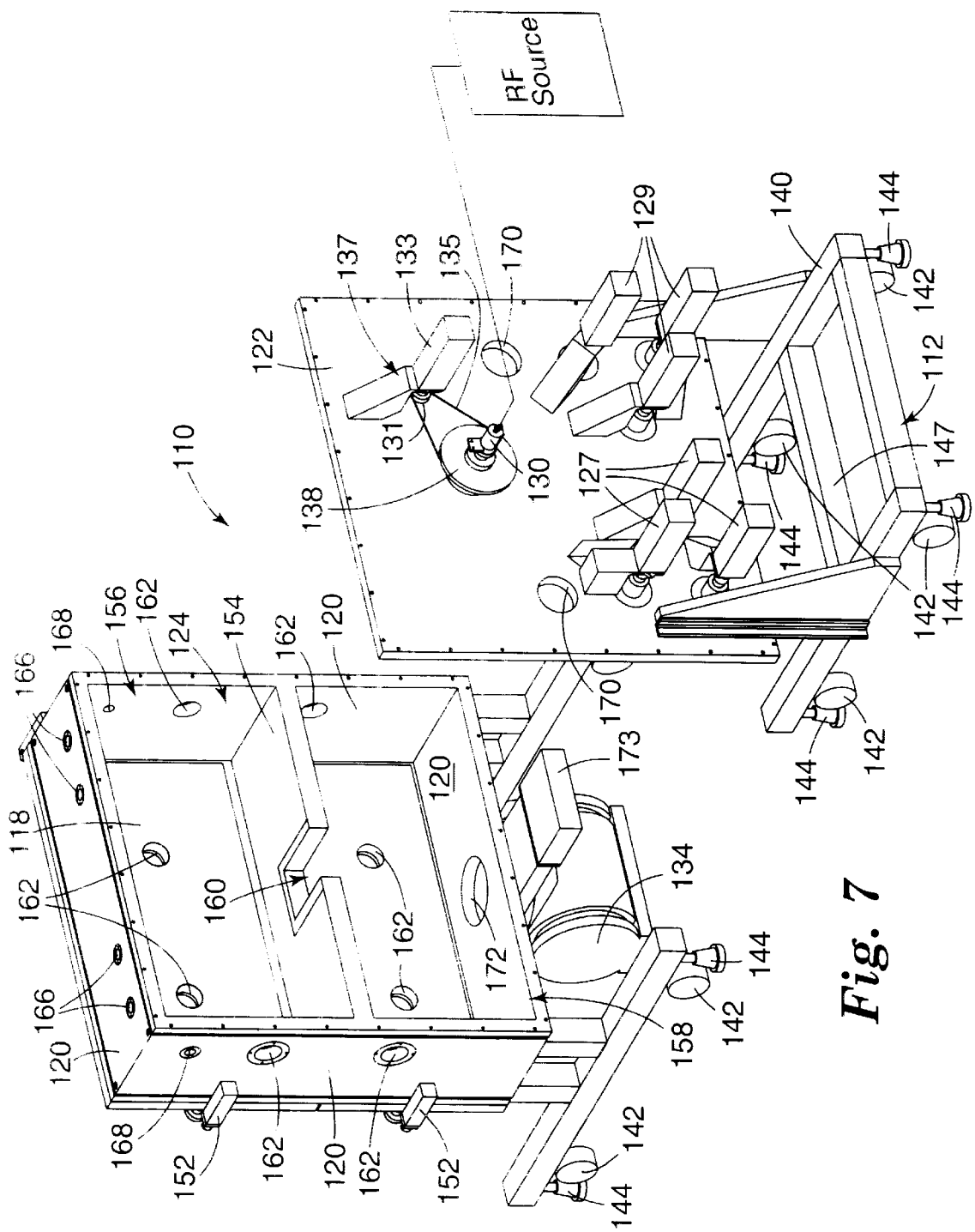
FIG. 7 is a second fragmentary perspective view of the apparatus of FIG. 5 taken from a different vantage point.

Referring now to FIGS. 6 and 7, an embodiment of a deposition apparatus of the present invention suitable for forming a static charge dissipative layer on a dielectric substrate is generally indicated as 110. The deposition apparatus 110 can be configured to perform a variety of deposition methods, including sputtering deposition, RF chemical vapor deposition and pulsed cathodic arc deposition.

The deposition apparatus 110 includes a common element for plasma creation and ion acceleration. The deposition apparatus 110 includes a support structure 112, a housing 114 including a front panel 116 of one or more doors 118, side walls 120 and a back plate 122 defining an inner chamber 124 therein divided into one or more compartments. A drum 126 is rotatably affixed within the chamber 124. A plurality of reel mechanisms are rotatably affixed within the chamber 124 and referred to generally as 128. A drive mechanism 137 for rotatably driving drum 126, idler rollers 132 rotatably is affixed within the chamber 124, and a vacuum pump 134 is fluidly connected to the chamber 124.

Support structure 112 is any means known in the art for supporting housing 114 in a desired configuration, a vertically upright manner in the present case. As shown in FIGS. 6 and 7, housing 114 can be a two-part housing, as described below in more detail. In this embodiment, support structure 112 includes cross supports 140 attached to each side of the two-part housing for supporting apparatus 110. Specifically, cross supports 140 include both wheels 142 and adjustable feet 144 for moving and supporting, respectively, apparatus 110. In the embodiment shown in FIGS. 6 and 7, cross supports 140 are attached to each side of housing 114 through attachment supports 146. Specifically, cross supports 140 are connected to one of the side walls 120, namely the bottom side wall, via attachment supports 146, while cross supports 140 on the other side of housing 114 are connected to a back plate 122 by attachment supports 146. An additional crossbar 147 is supplied between cross supports 140 on the right-hand side of apparatus 110 as shown in FIG. 6. This can provide additional structural reinforcement.

Housing 114 can be any means of providing a controlled environment that is capable of evacuation, containment of gas introduced after evacuation, plasma creation from the gas, ion acceleration, and film deposition. In the embodiment shown in FIGS. 6 and 7, housing 114 has outer walls that include front panel 116, four side walls 120, and the back plate 122. The outer walls define a box with a hollow interior, denoted as chamber 124. Side walls 120 and back plate 122 are fastened together, in any suitable manner known in the art, to rigidly secure the side walls 120 and the back plate 122 to one another in a manner sufficient to allow for evacuation of chamber 124, containment of a fluid for plasma creation, plasma creation, ion acceleration, and film deposition. Front panel 116 is not fixedly secured so as to provide access to chamber 124 to load and unload substrate materials and to perform maintenance. Front panel 116 is divided into two plates connected via hinges 150 (or an equivalent connection means) to one of side walls 120 to define the doors 118. These doors seal to the edge of side walls 120, preferably through the use of a vacuum seal (e.g., an O-ring). Locking mechanisms 152 selectively secure doors 118 to side walls 120 and can be any mechanism capable of securing doors 118 to walls 120 in a manner allowing for evacuation of chamber 124, storage of a fluid for plasma creation, plasma creation, ion acceleration, and film deposition.

Chamber 124, FIG. 7, is divided by a divider wall 154 into two compartments 156 and 158. A passage or hole 160 in wall 154 provides for passage of fluids or substrate between compartments. Alternatively, the chamber can be only one compartment or three or more compartments.

Housing 114, FIGS. 6 and 7, includes a plurality of view ports 162 with high pressure, clear polymeric plates 164 sealably covering ports 162 to allow for viewing of the film deposition process occurring therein. Housing 114 also includes a plurality of sensor ports 166 in which various sensors (e.g., temperature, pressure, etc.) can be secured. Housing 114 further includes inlet ports 168 providing for conduit connection through which fluid can be introduced into chamber 124 as needed to supply an environment conducive to film deposition. Housing 114 also includes pump ports 170 and 172 that allow gases and liquids to be pumped or otherwise evacuated from chamber 124.

Pump 134 is shown suspended from one of sides 120, preferably the bottom (as shown in FIG. 6). Pump 134 can be, for example, a turbo-molecular pump fluidly connected to the controlled environment within housing 114. Other pumps, such as diffusion pumps or cryopumps, can be used to evacuate lower chamber 158 and to maintain operating pressure therein. Sliding valve 173 is positioned along this fluid connection and can selectively intersect or block fluid communication between pump 134 and the interior of housing 114. Sliding valve 173 is movable over pump port 162 so that pump port 162 can be fully open, partially open, or closed with respect to fluid communication with pump 134.

Drum 126, FIG. 6, preferably is a cylindrical electrode 180 with an annular surface 182 and two planar end surfaces 184. The electrode can be made of any electrically conductive material and preferably is a metal such as, for example, aluminum, copper, steel, stainless steel, silver, chromium or an alloy of any one or more of the foregoing. Preferably, the electrode is aluminum, because of the ease of fabrication, low sputter yield, and low costs.

Drum 126 is further constructed to include non-coated, conductive regions that allow an electric field to permeate outward as well as non-conductive, insulative regions for preventing electric field permeation and thus for limiting film coating to the non-insulated or conductive portions of the electrode. The electrically non-conductive material typically is an insulator, such as a polymer (e.g., polytetrafluoroethylene). Various embodiments that fulfill this electrically non-conductive purpose so as to provide only a small channel, typically the width of the substrate to be coated as a conductive area, can be envisioned by one of ordinary skill in the art.

FIG. 6 shows an embodiment of drum 126 where annular surface 182 and end surfaces 184 of drum 126 are coated with an electrically non-conductive or insulative material, except for annular channel 190 in annular surface 182 which remains uncoated and thus electrically conductive. In addition, a pair of dark space shields 186 and 188 cover the insulative material on annular surface 182, and in some embodiments cover end surfaces 184. The insulative material limits the surface area of the electrode along which plasma creation and negative biasing may occur. However, because the insulative materials sometimes can become fouled by the ion bombardment, dark space shields 186 and 188 can cover part or all of the insulated material. The dark space shields 186 and 188 may be made from a metal such as aluminum but do not act as conductive agents because they are separated from the electrode by means of an insulating material (not shown). This allows confinement of the plasma to the electrode area.

Figure 8:
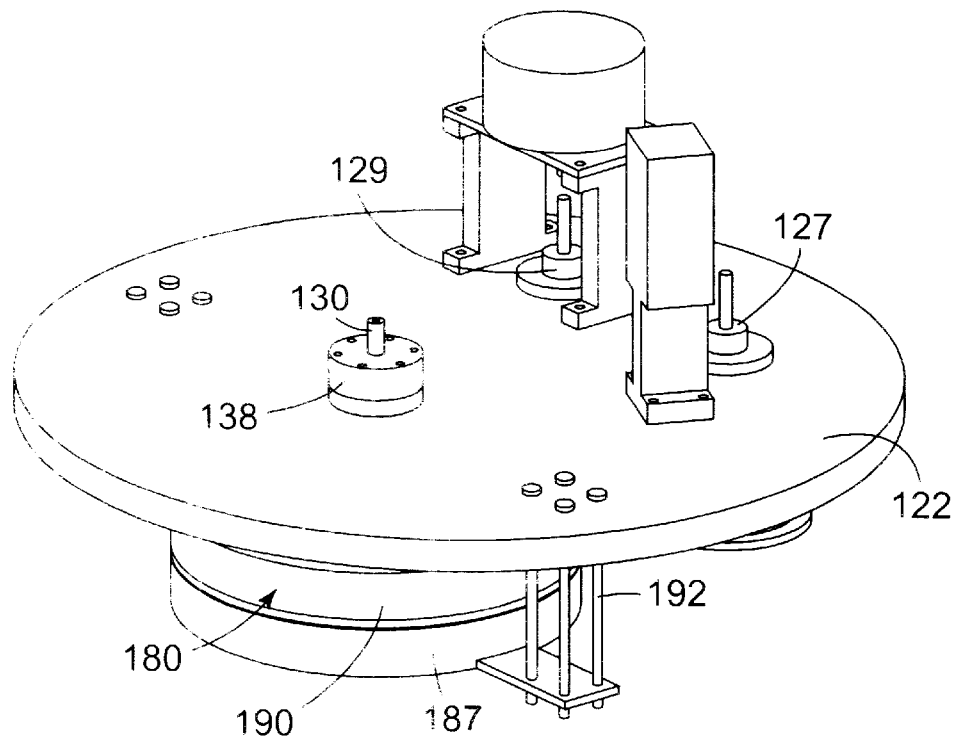
FIG. 8 is a fragmentary perspective view of another embodiment of the deposition apparatus of the present invention removed from its gas containing chamber.
Figure 9:
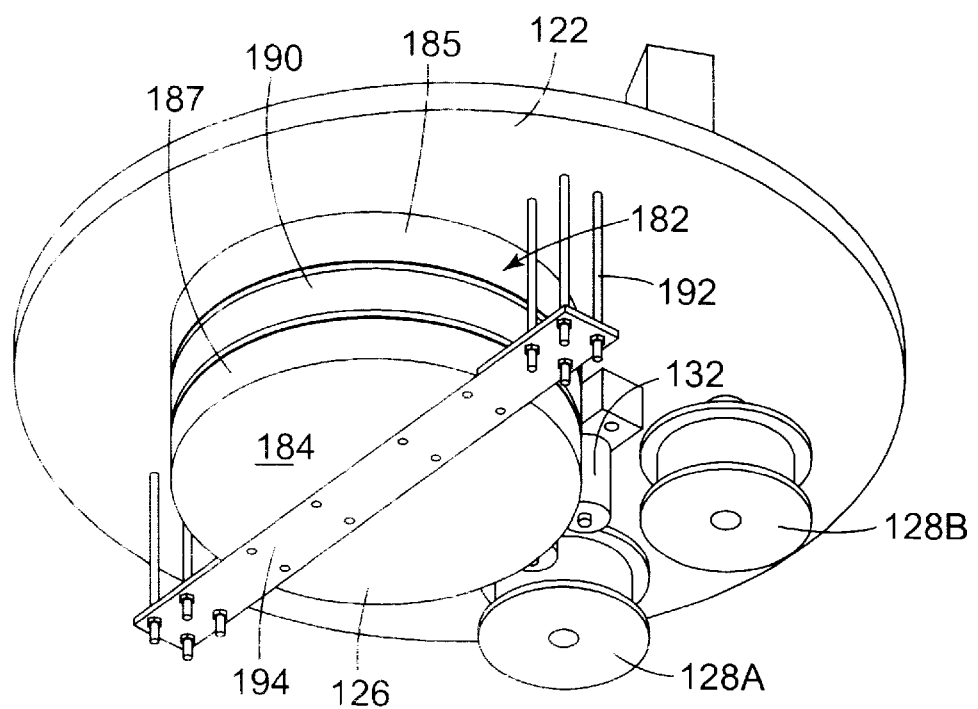
FIG. 9 is a second perspective view of the embodiment of FIG. 8 taken from a different vantage point.

Another embodiment of drum 126 is shown in FIGS. 8 and 9 where drum 126 includes a pair of insulative rings 185 and 187 affixed to annular surface 182 of drum 126. In some embodiments, insulative ring 187 is a cap which acts to also cover end surface 184. Bolts 192 secure support means 194, embodied as a flat plate or strap, to back plate 122. Bolts 192 and support means 194 can assist in supporting the various parts of drum 126. The pair of insulative rings 185 and 187, once affixed to annular surface 182, define an exposed electrode portion embodied as channel 190.

In any case, electrode 180 is covered in some manner by an insulative material in all areas except where the substrate contacts the electrode. This defines an exposed electrode portion that can be in intimate contact with the substrate. The remainder of the electrode is covered by an insulative material. When the electrode is powered and the electrode becomes negatively biased with respect to the resultant plasma, this relatively thick insulative material prevents carbon film deposition on the surfaces it covers. As a result, deposition is limited to the uncovered area (i.e., that which is not covered with insulative material, channel 190), which preferably is covered by relatively thin substrate material.

Still referring to FIGS. 8 and 9, drum 126 is rotatably affixed to back plate 122 through a ferrofluidic feedthrough and rotary union 138 (or an equivalent mechanism) affixed within a hole in back plate 122. The ferrofluidic feedthrough and rotary union provide separate fluid and electrical connection from a standard coolant fluid conduit and electrical wire to hollow coolant passages and the conductive electrode, respectively, of rotatable drum 126 during rotation while retaining a vacuum seal. The rotary union also supplies the necessary force to rotate the drum during film deposition, which force is supplied from any drive means such as a brushless DC servo motor. However, connection of drum 126 to back plate 122 and the conduit and wire may be performed by any means capable of supplying such a connection and is not limited to a ferrofluidic feedthrough and a rotary union. One example of such a ferrofluidic feedthrough and rotary union is a two-inch (about 5 cm) inner diameter hollow shaft feedthrough made by Ferrofluidics Co. (Nashua, N.H.).

Drum 126, FIG. 6, is rotatably driven by a drive assembly 137, FIG. 7, that can be any mechanical and/or electrical system capable of translating rotational motion to drum 126. In the embodiment shown in FIG. 7, drive assembly 137 includes motor 133 with a drive shaft terminating in drive pulley 131 that is mechanically connected to a driven pulley 139 rigidly connected to drum 126. Belt 135 (or equivalent structure) translates rotational motion from drive pulley 131 to driven pulley 139.

The plurality of reel mechanisms 128 are rotatably affixed to back plate 122. The plurality of reel mechanisms 128 includes a substrate reel mechanism with a pair of substrate spools 128A and 128B, and, in some embodiments, also can include a spacing web reel mechanism with a pair of spacing web spools 128C and 128D, and masking web reel mechanism with a pair of masking web spools 128E and 128F, where each pair includes one delivery and one take-up spool. As is apparent from FIG. 9, at least each take-up spool 128B, 128D, and 128F includes a drive mechanism 127 mechanically connected thereto such as a standard motor as described below for supplying a rotational force that selectively rotates the reel as needed during deposition. In addition, each delivery spool 128A, 128C, and 128E in select embodiments includes a tensioner for supplying tautness to the webs and/or a drive mechanism 129.

Each reel mechanism includes a delivery and a take-up spool which may be in the same or a different compartment from each other, which in turn may or may not be the same compartment the electrode is in. Each spool is of a standard construction with an axial rod and a rim radially extending from each end defining a groove in which an elongated member, in this case a substrate or web, is wrapped or wound. Each spool is securably affixed to a rotatable stem sealably extending through back plate 122. In the case of spools to be driven, the stem is mechanically connected to a motor (e.g., a brushless DC servo motor). In the case of non-driven spools, the spool is merely coupled in a rotatable manner through a coupling 129 to back plate 122 and may include a tension mechanism to prevent slack.

Film deposition apparatus 110, FIG. 9, also includes idler rollers 132 rotatably affixed within the chamber and pump 134 fluidly connected to the chamber. The idler rollers guide the substrate from the deposition delivery substrate spool 128A to channel 190 on drum 126 and from channel 190 to substrate take-up spool 128B. In addition, where spacing webs and masking webs are used, idler rollers 132 guide these webs and the substrate from deposition delivery substrate spool 128A and deposition masking web spool 128E to channel 190 and from channel 190 to take-up substrate spool 128B and take-up masking web spool 128F, respectively.

Film deposition apparatus 110 further includes a temperature control system for supplying temperature controlling fluid to electrode 180 via ferrofluidic feedthrough 138, FIG. 8. The temperature control system may be provided on apparatus 110 or alternatively may be provided from a separate system and pumped to apparatus 110 via conduits so long as the temperature control fluid is in fluid connection with passages within electrode 180. The temperature control system may heat or cool electrode 180 as is needed to supply an electrode of the proper temperature for film deposition. In a preferred embodiment, the temperature control system is a coolant system using a coolant such as, for example, water, ethylene glycol, chlorofluorocarbons, hydrofluoroethers, and liquefied gases (e.g., liquid nitrogen).

Film deposition apparatus 110 also includes an evacuation pump fluidly connected to evacuation ports 170, FIG. 7. This pump may be any vacuum pump, such as a Roots™ blower, a turbo molecular pump, a diffusion pump, or a cryopump capable of evacuating the chamber. In addition, this pump may be assisted or backed up by a mechanical pump. This evacuation pump may be provided on apparatus 110 or alternatively may be provided as a separate system and fluidly connected to the chamber.

Film deposition apparatus 110 also includes a fluid feeder, preferably in the form of a mass flow controller that regulates the fluid used to create the thin film. The fluid is pumped into the chamber after evacuation thereof. The feeder may be provided on apparatus 110 or alternatively may be provided as a separate system and fluidly connected to the chamber. The feeder supplies fluid in the proper volumetric rate or mass flow rate to the chamber during deposition. In a preferred embodiment, the film created is a thin carbon film having diamond-like properties. This film is created from a gas, supplied by the feeder, that contains molecules that include carbon atoms. Hydrocarbons are particularly preferred, although such species as buckminsterfullerenes, cyanide, tetramethylsilane, and halogenated carbon-containing gases such as fluorocarbons, chlorocarbons, and chlorofluorocarbons also are potentially useful. Hydrocarbons particularly useful for rapid carbon-rich (DLC) coatings include benzene, methylcyclopentadiene, butadiene, pentadiene, styrene, naphthalene, and azulene. Gases with low ionization potentials, that is 10 eV or less, can be used and preferably are used for continuous deposition of carbon-rich coating in this process.

Film deposition apparatus 110 also includes a power source electrically connected to electrode 180 via electrical terminal 130, FIG. 8. The power source may be provided on apparatus 110 or alternatively may be provided on a separate system and electrically connected to the electrode via electrical terminal (as shown in FIG. 7). In any case, the power source is any power generation or transmission system capable of supplying sufficient power.

A variety of power sources, such as radio frequency (RF) power, are possible. Radio frequency power is a preferred type of power because the frequency is high enough to form a self bias on an appropriately configured powered electrode but not high enough to create standing waves in the resulting plasma, which would be inefficient for ion deposition. RF power is scalable for high coating output (wide webs or substrates, rapid web speed). When RF power is used, the negative bias on the electrode is a negative self bias, i.e., no separate power source need be used to induce the negative bias on the electrode. Because RF power is preferred, the remainder of this discussion will focus exclusively thereon.

The RF power source powers electrode 180 with a frequency in the range of 0.01 to 50 MHz, preferably 13.56 MHz or any whole number (e.g., 1, 2, or 3) multiple thereof. This RF power as supplied to electrode 180 creates a carbon rich plasma from the hydrocarbon gas within the chamber. The RF power source can be an RF generator such as a 13.56 MHz oscillator connected to the electrode via a network that acts to match the impedance of the power supply with that of the transmission line (which is usually 50 ohms resistive) so as to effectively transmit RF power through a coaxial transmission line.

Upon application of RF power to the electrode, the plasma is established. In an RF plasma, the powered electrode becomes negatively biased relative to the plasma. This bias is generally in the range of 500 to 1400 volts. This biasing causes ions within the carbon-rich plasma to accelerate toward electrode 180. Accelerating ions form the carbon-rich coating on the substrate in contact with electrode 180 as is described in more detail below.

Deposition Process

In operation, a full spool of substrate upon which deposition is desired is inserted over the stem as delivery spool 128A. Access to these spools is provided through lower door 118 because, in FIG. 7, the spools are located in lower compartment 158 while deposition occurs in upper compartment 156. In addition, an empty spool is fastened opposite the substrate holding spool as spool 128B so as to function as the take-up spool after deposition has occurred on the substrate.

If a spacer web is desired to cushion the substrate during winding or unwinding, spacer web delivery and/or take-up spool can be provided as spools 128C and 128D (although the location of the spools in the particular locations shown in the figures is not critical). Similarly, if film deposition is desired in a pattern or otherwise partial manner, a masking web can be positioned on a delivery spool such as spool 128E and an empty spool is positioned as a take-up spool such as spool 128F.

After all of the spools with and without substrates or webs are positioned, the substrate on which deposition is to occur (and any masking web to travel therewith around the electrode) are woven or otherwise pulled through the system to the take-up reels. Spacer webs generally are not woven through the system and instead separate from the substrate just before this step and/or are provided just after this step. The substrate is specifically wrapped around electrode 180 in channel 190 thereby covering the exposed electrode portion. The substrate is sufficiently taut to remain in contact with the electrode and to move with the electrode as the electrode rotates so that a length of substrate is always in contact with the electrode for deposition. This allows the substrate to be coated in a continuous process from one end of a roll to the other. The substrate is in position for film deposition and lower door 118 is sealed closed.

A preferred type of substrate is a flexible web. Common examples include polymeric (e.g., polyester, polyamide, polyimide, polycarbonate, polyurethane, or polyolefin) webs and webs having at least one surface including a metallized coating, that can be used to define one or more electrical circuits. (See, e.g., U.S. Pat. No. 5,227,008, incorporated herein by reference, for a description of such a membrane.) When a spool of the latter type of web is used, the process and apparatus of the present invention can apply a carbon-rich coating (e.g., a DLC coating) to one surface of the entire length of the web. Thus, the web or any material coated thereon, such as an electrical circuit, can be protected by a uniform coating of a carbon-rich material.

Chamber 124 is evacuated to remove all air and other impurities. Once a carbon-containing fluid, preferably a gas, is pumped into the evacuated chamber, the apparatus is ready to begin the process of film deposition.

The RF power source is activated to provide an RF electric field to electrode 180. This RF electric field causes the carbon-containing material to become ionized, resulting in the formation of a carbon rich plasma with ions therein. This is specifically produced using a 13.56 MHz oscillator, although other RF sources and frequency ranges may be used.

Once the plasma has been created, a negative DC bias voltage is created on electrode 180 by continuing to power the electrode with RF power. This bias causes ions to accelerate toward non-insulated electrode portion 190 of electrode 180 (the remainder of the electrode is either insulated or shielded). The ions bombard the length of the substrate in contact with channel 190 of electrode 180 causing a densification of carbon resulting in the deposition of a thin diamond-like carbon film on that length of substrate.

For continuous deposition, the take-up spools are driven so as to pull the substrate and any masking webs through the upper compartment 154 and over electrode 180 so that deposition occurs on any unmasked substrate portions in contact with annular channel 190 (otherwise, the masking web receives the carbon film). The substrate is thus pulled through the upper compartment continuously while a continuous RF field is placed on the electrode and sufficient carbon-containing gas is present within the chamber. The result is a continuous carbon-rich coating on an elongated substrate, and substantially only on the substrate. Carbon film deposition does not occur on the insulated portions of the electrode nor does deposition occur elsewhere in the chamber, because only the electrode is biased. In addition, because the non-insulated portion of the electrode (i.e., annular channel 190) is covered almost or entirely by the substrate, little or no deposition occurs anywhere but on the substrate. This eliminates the need for frequent cleaning of the chamber and parts thereof and replacing the electrode due to carbon buildup. In cases where fouling of the insulated portion occurs, dark space shields 186 and 188 can be provided to prohibit or reduce fouling. Dark space shields 186 and 188 can be of any shape, size, and material that is conducive to the reduction of potential fouling. In the embodiment shown in FIGS. 6, dark space shields 186 and 188 are metal rings that fit over drum 126 and the insulation thereon. Dark space shields 186 and 188 do not bias due to the insulative material that covers drum 126 in the areas where dark space shields 186 and 188 contact drum 126. The dark space shields 186 and 188 in this ring-like embodiment further include tabs on each end thereof extending away from drum 126 in a non-annular manner. These tabs can assist in aligning the substrate within channel 190.

Preferably, the temperature control system pumps fluid through electrode 180 throughout the process to keep the electrode at a desired temperature. Typically, this involves cooling the electrode with a coolant as described above, although heating in some cases may be desirable. In addition, because the substrate is in direct contact with the electrode, heat transfer from the plasma to the substrate is managed through this cooling system, thereby allowing the coating of temperature sensitive films such as polyethyleneterephthalate, polyethylene naphthalate, and the like. After completion of the deposition process, the spools can be removed from shafts supporting them on the wall.

Low ionization potential gases can be used to obtain extremely high deposition rates while still maintaining good properties in the thin carbon film. By using low ionization potential gases, very fast deposition is possible and low DLC coating film stress is produced. The DLC coating film stress is 0.4 GPa or lower, in comparison to 1 to 10 GPa for the DLC film stress reported in previous DLC coatings. Mass deposition on the substrate is at rates up to forty or more times higher than the prior art rates of deposition. Minimal deposition occurs anywhere except on the substrate, and, as a result, minimal flaking occurs. Furthermore, deposition is almost entirely due to ion bombardment rather than a mixture of ion bombardment and free radical contact. In addition, very high conversion yields (as much as 35%) of gas input to film output, in comparison to typically single digit yields in the prior art, can be obtained.

Other benefits and advantages of this process include the ability to coat over a broader range of substrate dimensions including widths of between about 15 cm and about one meter. Substrate width is not a limiting factor because ion bombardment comes from all around the substrate in the chamber rather than from a source specific area. According to the method of the present invention, a substrate can be coated to a thickness up to about 0.2 $\mu$m at a rate of approximately 1.5 to 6 m/min, generally without regard to substrate width. Coating thicknesses in the range of 0.01 to 0.3 $\mu$m can be produced easily using this process, although thicker (i.e., up to about 10 $\mu$m) and thinner coatings also are possible.

Overall, plasma generation and ion acceleration is greatly simplified. Only one electrode is used rather than a source electrode and a target electrode. The powered electrode both creates the plasma and becomes negatively biased, thereby accelerating ions within the plasma toward itself for bombardment of the substrate in contact with itself. This DC biasing voltage also serves to density the deposited coating, which enhances the properties of diamond rich coatings.

Circuit Fabrication Process

The process of making flexible circuits and carriers according to the invention comprises the step of depositing at least one layer of diamond-like carbon thereon which may be used in conjunction with various known procedures such as metal sputtering, plating resist laminating, resist exposing, developing, etching, and plating. The sequence of such procedures may be varied as desired for the particular application.

A method for making a flexible circuit or carrier, commonly referred to as an additive method, has a typical sequence of steps described below.

First, deposition of a conformal diamond-like carbon layer onto the polymer, e.g., polyimide side, of a film substrate. The substrate may be made by various methods such as adhesively bonding a cured polymer layer onto copper foil, coating liquid polyimide on copper foil or the like. Typically, the substrate includes a polymeric film layer of between about 25 micrometers and about 125 micrometers, with the copper layer being from about 1 to about 5 micrometers thick.

Next, sputtering of the polyimide film with a seed layer of chrome and copper is performed. Photoresists, which may be aqueous or solvent based, and may be negative or positive photoresists, are then laminated onto both sides of a substrate having a polymeric film side and a copper side, using standard laminating techniques with hot rollers. The thickness of the photoresist is from about 35 to about 50 micrometers. The photoresist is then exposed on both sides to ultraviolet light or the like, through a mask or phototool, crosslinking the exposed portions of the resist. The unexposed portions of the photoresist are then developed with the appropriate, solvent, in the case of aqueous resists a dilute aqueous solution, e.g., a 0.5–1.5% sodium or potassium carbonate solution, is applied until desired patterns are obtained on both sides of the laminate. The copper side of the laminate is then further plated to desired circuit thickness. One or more layers of diamond-like carbon may also be deposited atop the copper if desired.

The laminate is then placed into a bath of concentrated base at a temperature of between about 50° C. and about 120° C. which etches the portions of the polymeric film not covered by the crosslinked resist. This exposes certain areas of the original thin copper layer. The resist is then stripped off both sides of the laminate in a 2–5% solution of an alkaline metal hydroxide at from about 20° C. to about 80° C., preferably from about 20° C. to about 60° C. Subsequently, the original thin copper layer is etched where exposed with an etchant which does not harm the polymeric film, e.g., Perma-etch®, available from Electrochemicals, Inc. The final circuits have copper circuitry on one side, and a diamond-like coating on a polyimide surface on the opposing side, and any diamond-like carbon layers deposited between internal layers or on individual features.

Next come converting and auditing steps where the substrate is cut into smaller strips.

In an alternate additive process which is preferable where very hard diamond-like carbon coatings are used, and there is a propensity for cracking during early lamination and sputtering steps, the diamond-like carbon may be deposited on the polyimide side of the substrate after the flash copper plating step, with the remaining steps of the process being as described above.

In another type of process called a substractive process, aqueous processible photoresists are laminated onto both sides of a substrate having a polymeric film side and a thick copper side, using standard laminating techniques. The substrate used in this process includes a polymeric film layer about 12 micrometers to about 125 micrometers thick with the copper layer being from about 12 to about 40 micrometers thick (in the additive process, the copper layer is 1–5 micrometers thick).

The photoresist is then exposed on both sides to ultraviolet light or the like, through a suitable mask, crosslinking the exposed portions of the resist. The image is then developed with a dilute aqueous solution until desired patterns are obtained on both sides of the laminate. The thick copper layer is then etched to define a plurality of conductive elements, and portions of the polymeric layer are thus exposed.

An additional layer of aqueous photoresist is then laminated over the first resist on the copper side and crosslinked by flood exposure to a radiation source in order to protect exposed polymeric film surface (on the copper side) from further etching. Areas of the polymeric film (on the film side) not covered by the crosslinked resist are then etched with the concentrated base at a temperature of between about 70° C. and about 120° C., and the photoresists are then stripped from both sides with a dilute basic solution. Next come converting and auditing steps.

A layer of diamond-like carbon is then formed over and extends between at least a portion of two of the conductive elements. In some applications it will be desirable to form a conformal layer of material over the entire circuit substrate, including the conductive elements. In other applications, it will be desirable to form a conformal layer of material only over portions of the conductive elements. The layer of material can be formed using a mechanical masking process wherein a static charge dissipative layer such as diamond-like carbon is deposited through an appropriate mask.

Other steps may also be included in these processes, such as soaking the film in hot water before or after the etching bath, rinse steps and the like. Acid baths may also be used as a post-etching neutralization, and web cleaning steps may follow plating steps.

To create finished flexible circuits, interconnect bonding tape for "TAB" (tape automated bonding) processes, microflexible circuits, and the like, further layers may be added and processed. The copper plating may be plated with gold, tin, or nickel for subsequent soldering procedures and the like according to conventional means. In the case where a conformal static charge dissipative layer is formed over the conductive elements, the conformal static charge dissipative layer is formed after the final plating step.

Means for interconnection of the flexible circuit to the printed circuit board or other device may be selected from any conventional means, connecting the pads or other connection points including solder balls, reflow solder, thermal compression bonding, wire bonding, inner lead bonding and the like.

Flexible circuits formed from carriers and processes of the invention are useful in electronic packages such as ball grid arrays, chip scale packages, single and multiple metal layer packages and the like. Such circuits and packages can be designed for use in any electronic device, including but not limited to recording devices, printing devices, single or multimedia devices, projectors, cameras, computers, data storage devices and the like.

The following examples are meant to be illustrative and are not intended to limit the scope of the invention which is expressed solely by the claims.

EXAMPLES

Example 1

Diamond-like carbon films were continuously deposited on a 50 micron Kapton® ( (polyimide )web by a RF chemical vapor deposition process using the apparatus described herein. In this process, the polyimide web was wrapped around a chilled drum (15.24 cm diameter×15.24 cm long) to which radio frequency (RF) power (at 13.56 Mhz frequency) was supplied. The RF power serves to initiate and sustain a plasma of a hydrocarbon gas (butene) utilized to deposit the diamond-like carbon films. A steady-state DC self-bias voltage appears on the substrate web wrapped around the drum. A series of samples was prepared under the following conditions of deposition, producing the specified surface resistivity.

| Butene Flow Rate (sccm) | Nitrogen Flow Rate (sccm) | Argon Flow Rate (sccm) | RF Power (watts) | Pressure (mTorr) | Web Speed (fpm) | Surface Resistivity (ohms/□) |
| --- | --- | --- | --- | --- | --- | --- |
| 50 | 0 | 200 | 1200 | 20 | 2 | $1 \times 10^7$ |
| 20 | 20 | 460 | 1000 | 35 | 5 | $4 \times 10^8$ |
| 100 | 100 | 0 | 1000 | 15 | 30 | $2 \times 10^{10}$ |
| 100 | 100 | 100 | 1000 | 20 | 30 | $4 \times 10^{10}$ |

Example 2

Diamond-like carbon films were continuously deposited on a 50 micron Kapton® (polyimide) web by a pulsed cathodic arc deposition process using the deposition apparatus described herein. An electric field is established between a solid carbon alloy target (5–7% copper) and a rotating electrode. The electrode is a chilled drum, around which the polyimide web was wrapped. The pulsed electric field establishes a corresponding pulsed arc between the target and the substrate, resulting in a layer of diamond-like carbon being formed on the substrate. A series of samples was prepared under the following conditions of deposition, producing the specified surface resistivity.

| Frequency (Hz) | Pressure (mTorr) | Speed (ipm) | Resistivity (ohms/□) |
| --- | --- | --- | --- |
| 5 | 20 | 9 | $6 \times 10^6$ |
| 5 | 10 | 13 | $4 \times 10^7$ |
| 5 | 30 | 35 | $6 \times 10^8$ |
| 5 | 50 | 45 | $6 \times 10^9$ |
| 5 | 60 | 55 | $5 \times 10^{10}$ |
| 10 | 40 | 15 | $2 \times 10^7$ |
| 20 | 40 | 45 | $8 \times 10^7$ |

Example 3

Diamond-like carbon films were continuously deposited on a 50 micron Kapton® (polyimide) web by a DC magnetron sputtering deposition process using the deposition apparatus described herein. An electric field is established between a solid graphite target and a rotating electrode. The electrode is a chilled drum, around which the polyimide web was wrapped. The pulsed electric field establishes a corresponding pulsed arc between the target and the substrate, resulting in a layer of diamond-like carbon being formed on the substrate. A series of samples was prepared under the following conditions of deposition, producing the specified surface resistivity.

| Power (Watts) | Pressure (mTorr) | Voltage (V) | Ar Flow (sccm) | Speed (fpm) | Resistivity (ohms/□) |
| --- | --- | --- | --- | --- | --- |
| 2000 | 13.2 | 768 | 150 | 4 | $4 \times 10^{10}$ |
| 4000 | 7.6 | 890 | 150 | 4 | $2 \times 10^9$ |
| 4000 | 9.5 | 864 | 200 | 4 | $5 \times 10^8$ |
| 4000 | 14.6 | 865 | 170 | 8 | $3 \times 10^7$ |
| 5000 | 16.9 | 825 | 200 | 8 | $8 \times 10^{11}$ |

What is claimed is:

1. A circuit, comprising:
   a dielectric substrate;
   a conductive layer mounted on a surface of the dielectric substrate, the conductive layer patterned to define a plurality of spaced apart conductive elements; and
   a static charge dissipative layer in contact with and extending between at least two of the conductive elements, the static charge dissipative layer having a thickness of from about 200 Ångstroms to about 2000 Ångstroms, a surface resistivity of between about $1 \times 10^5$ and about $1 \times 10^{10}$ ohms/□ and being made of a material selected from the group consisting of diamond-like carbon, silicon nitride, boron nitride, boron trifluoride, silicon carbide and silicon dioxide.

2. The circuit of claim 1 wherein a portion of the static charge dissipative layer is disposed on an exposed surface of the conductive layer.

3. The circuit of claim 2 wherein the static charge dissipative layer is a conformal static charge dissipative layer.

4. The circuit of claim 1 wherein the static charge dissipative layer mounted directly onto the dielectric substrate.

5. A circuit, comprising:
   a dielectric substrate;
   a conductive layer mounted on a surface of the dielectric substrate, the conductive layer patterned to define a plurality of spaced apart conductive elements; and
   a static charge dissipative layer in contact with and extending between at least two of the conductive elements, the static charge dissipative layer having a thickness of from about 200 Ångstroms to about 2000 Ångstroms, a surface resistivity of between about $1\times10^5$ and about $1\times10^{10}$ ohms/□ and being made of a material selected from the group consisting of diamond-like carbon, silicon nitride, boron nitride, boron trifluoride, silicon carbide and silicon dioxide wherein a portion of the static charge dissipative layer is disposed between the dielectric substrate and the conductive layer.

6. The circuit of claim 5 wherein the static charge dissipative layer has a surface resisitivity of between about $1\times10^6$ and about $1\times10^8$ ohms/□.

7. The circuit of claim 5 wherein the static charge dissipative layer is made of diamond-like carbon.

8. The circuit of claim 5 wherein the conductive elements include a routing portion and a bonding portion and wherein the static charge dissipative layer is formed on an exposed surface of the routing portion.

9. The circuit of claim 5 wherein the static charge dissipative layer is patterned to define a gap therein extending between two adjacent conductive elements.

10. The circuit of claim 5 wherein the static charge dissipative layer has a thickness of between about 200 Ångstroms and about 500 Ångstroms.

11. The circuit of claim 5 wherein the static charge dissipative layer is made of a material including a highly conductive alloy material.

12. The circuit of claim 11 wherein the alloy material is selected from a group of materials consisting of copper, aluminum, titanium, nickel and chromium.

13. The circuit of claim 5 wherein the dielectric substrate is a flexible polymeric material.

14. The circuit of claim 13 wherein the flexible polymeric material is selected from the group consisting polyimide and polyester.

15. An electronic package, comprising:
a flexible dielectric substrate including a plurality of apertures extending therethrough;
a plurality of spaced apart conductive elements mounted on the dielectric substrate, each one of the conductive elements including a bonding portion and a routing portion; and
a conformal static charge dissipative layer formed on an exposed surface of and extending between the routing portion of two conductive elements such that a first conductive element is electrically connected to a second conductive element through the static charge dissipative layer, the static charge dissipative layer having a surface resistivity of between about $1\times10^5$ and about $1\times10^{10}$ ohms/□ and being made of a material selected from the group consisting of diamond-like carbon, silicon nitride, boron nitride, boron trifluoride, silicon carbide and silicon dioxide.

16. A process for making a printed circuit, comprising the steps of:
forming a plurality of conductive elements on a dielectric substrate; and
forming a static charge dissipative layer in contact with and extending between at least two of the conductive elements, the static charge dissipative layer having a surface resistivity of between about $1\times10^5$ and about $1\times10^{10}$ ohms/□ and being made of a material selected from the group consisting of diamond-like carbon, silicon nitride, boron nitride, boron trifluoride, silicon carbide and silicon dioxide, wherein the step of forming the conductive elements is performed after the step of forming the static charge dissipative layer.

17. The process of claim 16 wherein the step of forming the conductive elements include the step of forming a routing portion and a bonding portion and wherein the step of forming the static charge dissipative layer includes the step of forming the static charge dissipating layer on an exposed surface of the routing portion.

18. The process of claim 16 wherein the step of forming the static charge dissipative layer includes the step of patterning the static charge dissipative layer to define a gap therein extending between two adjacent conductive elements.

19. The process of claim 16 wherein step of forming the static charge dissipative layer includes forming the static charge dissipating layer using a solid carbon alloy target made of a material including a highly conductive alloy material.

* * * * *